Figure 1:
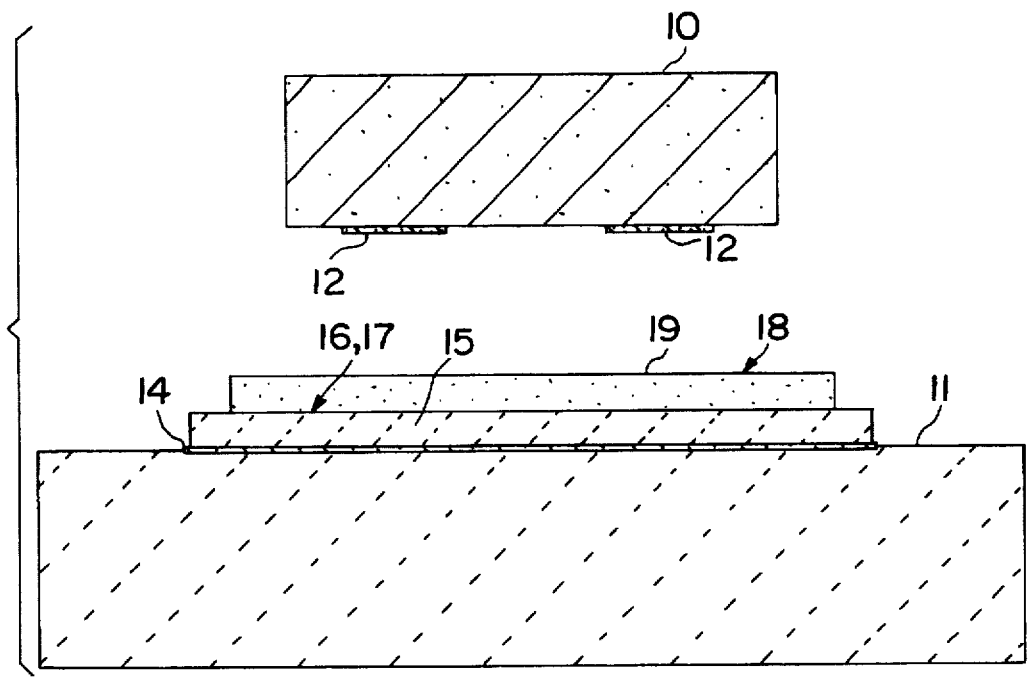

United States Patent [19]
Weiss et al.

[11] Patent Number: 5,785,234
[45] Date of Patent: Jul. 28, 1998

[54] METHOD OF SURFACE-CONTACTING ELECTRONIC COMPONENTS

[75] Inventors: Stefan Weiss; Elke Zakel, both of Berlin, Germany

[73] Assignee: Fraunhofer-Gesellschaft zur Forderung der angewandten Forschung e.V., Munich, Germany

[21] Appl. No.: 623,540

[22] Filed: Mar. 29, 1996

[30] Foreign Application Priority Data

Mar. 31, 1995 [DE] Germany ............ 195 11 898.7

[51] Int. Cl.$^6$ ............................................ A05K 3/34
[52] U.S. Cl. ............................ 228/223; 228/180.22
[58] Field of Search .................... 228/180.22, 207, 228/223, 224, 214; 216/100, 105

[56] References Cited

U.S. PATENT DOCUMENTS

| | | | |
|---|---|---|---|
| 5,150,832 | 9/1992 | Degani et al. | 228/224 |
| 5,177,134 | 1/1993 | Mullen, III et al. | 524/284 |
| 5,281,281 | 1/1994 | Stefanowski | 228/223 |

FOREIGN PATENT DOCUMENTS

| | | |
|---|---|---|
| 9005025 U | 5/1990 | Germany . |
| 43 35 800 | 10/1993 | Germany . |
| 3-218645 | 9/1991 | Japan . |
| PCT/US88/02838 | 8/1988 | WIPO . |

OTHER PUBLICATIONS

Patent Abstracts of Japan, vol. 015, No. 502 (E-1147), Dec. 18, 1991; JP-A-03-218645, Sep. 26, 1991.
International Search Report PCT/DE96/00495, Jul. 9, 1996.
Patent Abstracts of Japan, E-1465, Nov. 26, 1993, vol. 17, No. 640, JA-206220 (13 Aug. 1993).
Patent Abstracts of Japan, E-1136, Nov. 21, 1991, vol. 15, No. 459, JA-196650 (28 Aug. 1991).

*Primary Examiner*—Samuel M. Heinrich
*Attorney, Agent, or Firm*—Larry L. Saret; Laff, Whitesel, Conte & Saret, Ltd.

[57] ABSTRACT

A method of joining an electronic component (10) provided with contact surfaces (12) to a substrate (11) comprising contact surfaces (14) via contact metal coatings (16, 17) formed between the contact surfaces and made of a solderable or weldable joining material (15), the electronic component and the substrate being pressed together and heated, and during the joining operation a layer (18) of a medium (19) containing a polyalcohol is disposed at least between the joining material (15) and the contact surfaces (12) of the electronic component (10) or the substrate (11).

20 Claims, 1 Drawing Sheet

METHOD OF SURFACE-CONTACTING ELECTRONIC COMPONENTS

The invention relates to a method of joining an electronic component provided with contact surfaces to a substrate having contact surfaces, via contact metal coatings formed between the contact surfaces and made of a solderable or weldable joining material, the electronic component and the substrate being pressed together and heated.

Particularly when a soldering process is used for surface contacting of electronic components, the contact surfaces have to be very thoroughly wetted with soldering material owing to the relatively low contact pressures during the joining operation, in order to obtain a reliable soldered joint. It is therefore necessary to break up any oxide skins on the soldering material. It is also essential not to form any air inclusions (cavities) in the contact layer formed from the soldering material, since these have an electrically insulating effect and may cause the electronic component to fail. Similar considerations apply to welded joints, although in these, owing to the higher contact forces, the risk of cavity formation is undoubtedly greater than the risk of insufficient wetting.

In soldering-only processes, it is now customary to use fluxes for eliminating oxide skins during the joining operations. Fluxes however are very corrosive chemically and the residues have to be removed by complicated cleaning processes after the joining operation, since otherwise they may damage the surface of the component and substrate and thus considerably reduce the reliability of the joint.

When an electronic component is joined to a substrate by ultrasonic welding, a method called "scrubbing" is used for mechanically breaking up the oxide skins by rubbing the contact surfaces of the electronic component on the contact surfaces of the substrate. This method, however, results in increased cavity formation in the contact layer. There are also difficulties in applying it to electronic components or substrates made of sensitive or brittle materials, since the mechanical rubbing may result in fractures or damage to at least one of the substances joined (i.e. the component or the substrate).

Finally it is know simply to use the contact pressure generated during the joining operation to break up the oxide skins formed on the joining material, and to prevent re-formation of oxide skins by carrying out the joining operation in a reducing atmosphere. Usually the reducing atmosphere is obtained by using gaseous mixtures of nitrogen and hydrogen, up to pure hydrogen. The reducing effect is dependent mainly on the hydrogen content. Since the reducing gas mixture becomes increasingly explosive when the hydrogen content is more than 5%, a joining operation and equipment used under these conditions are subject to extremely high safety requirements. This increases the cost of the process.

The object of the invention therefore is to devise a process of surface contacting an electronic component on a substrate, so as to obtain a reliable joint without the previously-described disadvantageous effects.

This object is achieved by a method having the features in claim 1.

In the method according to the invention, an intermediate layer of a medium containing a polyalcohol is disposed between the contact surfaces of the electronic component or substrate and the joining material during the joining operation.

In the method according to the invention, the inert effect of the alcohol for wetting the joining material is used to prevent the oxide skins previously broken up by the contact pressure from re-forming when the contact surfaces are heated during the joining operation. In contrast to fluxes, polyalcohols are not chemically corrosive and are soluble in water, so that they are no danger to health and residues of alcohol remaining in the contact region between the joined substances can simply be rinsed off with water after the joining operation. If the boiling temperature of the medium containing the polyalcohol is adapted to the temperature of the joining material during melting thereof, the medium can be evaporated without leaving a residue, so that subsequent cleaning is superfluous.

Use of glycerol as the medium has been found particularly advantageous, particularly in view of its easy wettability and its boiling temperature, which is suitable for most joining materials. This particularly applies when a euteotic gold/tin solder alloy with a melting-point of about 280° C. is used. Glycerol evaporates at this temperature. When this combination of soldering material and polyalcohol are used, therefore, no residues are left between the joined substances.

The intermediate layer formed by the medium can be continuous or can comprise individual partial layers disposed between the respective contact-surface pairings between the joined substances (the component and the substrate).

A continuous intermediate layer is particularly advantageous if the method according to the invention is used for so-called "die bonding" and the soldering material is a so-called "preform" in continuous platelets applied to the contact-surface region of the substrate. However, a continuous intermediate layer and consequent application of the polyalcohol-containing medium over the entire surface may also be advantageous in so-called "flip-chop bonding". In this method of bonding, the joining material is disposed in the form of elevated contact surfaces or so-called "bumps" on the contact surfaces of the component, which in this case is a chip.

It may however be advantageous, particularly in the aforementioned bonding method, for the medium containing polyalcohol to be applied in the form of individual partial layers disposed between the respective contact-surface pairings between the component and the substrate. The medium can be non-continuously applied in this manner e.g. by a punch.

Particularly advantageously, the medium has a boiling-point equal to or only slightly above the melting temperature of the joining material or the joining temperature in the joining material during melting, which is usually slightly above the melting-point. If the boiling temperature of the medium is adjusted in this manner, the medium can be evaporated without residue during the joining operation, and also the medium acts as a system limiting the temperature of the joining material, since overheating thereof is prevented by evaporation of the medium. As a result the requirements on control of the joining temperature are considerably reduced, so that the component or the substrate can be prevented from overheating and consequent damage even without complicated control.

Advantageously also the component and/or the substrate are heated to an elevated temperature before the joining operation and are heated to the joining temperature by pulses during the joining operation. This results in a particularly uniform structure of the contact layer of joining material formed between the joined substances or the contact surfaces thereof, which particularly improves the reliability of the joint.

The method of joining described hereinbefore with respect to selected advantages is particularly advantageous for assembling opto-electronic components on a substrate, using a preferably eutectic gold/tin alloy for the joining material in combination with the polyalcohol (glycerol). Since glycerol evaporates at a temperature of about 280° C., no residues are left on the chip or optical surfaces. In addition, glycerol does not corrode the optical surfaces.

Figure 2:
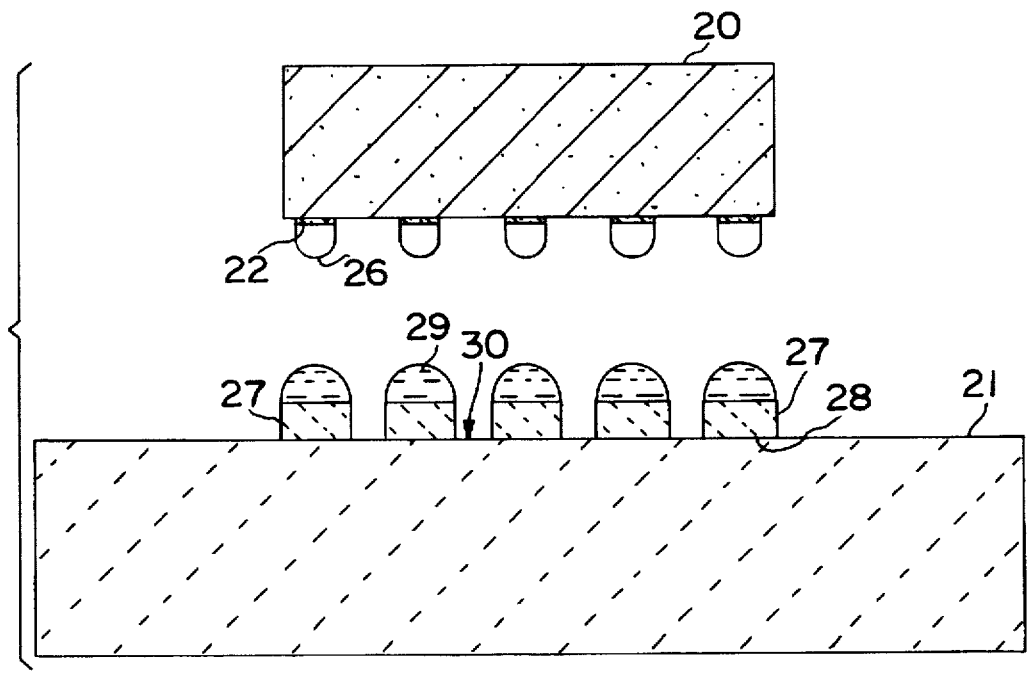

Two preferred variants of the method according to the invention will now be described in detail with reference to the drawings, in which:

FIG. 1 illustrates application of a variant of the method according to the invention to "die bonding" and FIG. 2 illustrates application of a variant of the method according to the invention to "flip-chip bonding".

FIG. 1 shows a die or chip 10 positioned above a substrate 11 for joining thereto. Contact surfaces 12 of the chip 10 are aligned with and overlap contact surfaces 14 of the substrate 11. The contact surfaces 14 of the substrate 11 are disposed horizontally one behind the other on the substrate 11 at right angles to the plane of the drawing and, in the embodiment shown here, are provided with solder pads 16, 17 for preparing a soldering material 15 for a joint between the substances for joining (i.e. the chip 10 and substrate 11 in the present case).

As an alternative to forming the solder pads 16, 17 on the contact surfaces 14 of the substrate 11, a "solder preform" can be disposed on the surface of the substrate 11 so as to provide the soldering material 15 for the subsequent joint.

A layer 18 of a polyalcohol-containing medium 19, i.e. glycerol in the present embodiment, is disposed on the solder pads 16, 17 or on the otherwise-applied soldering material 15 disposed on the contact surfaces 14 of the substrate 11.

In the embodiment shown in FIG. 1, as also in the embodiment shown in FIG. 2, the soldering material 15 comprises a eutectic gold/tin alloy having a melting temperature of about 280° C. This temperature corresponds to the boiling temperature of glycerol. Experiments have also shown the advantage of a combination of lead-tin soldering alloys and indium-containing solder with an inert material in the form of glycerol.

Before the actual joining operation, in the embodiment shown here, the chip 10 and the substrate 11 are both heated to an elevated starting temperature. To make the joint, the chip 10 is lowered on to the substrate by a suitable tool, normally called a bonding tool (not shown here), and simultaneously a pressure of about 50 cN/mm² is exerted by the tool on the substances for joining. The pressure breaks any oxide skins on the surfaces of the soldering pads 16, 17, so that they cannot disadvantageously influence the subsequent joining operation.

When the joint is being made, the inert medium 19 forms a protective atmosphere which prevents re-oxidation of the soldering material 15. To make the joint in the embodiment shown here, the chip 10 is heated by the bonding tool by pulse heating to an elevated temperature, so that the required temperature is obtained for melting the soldering material 15.

In the embodiment shown here, the melting and boiling temperature of the soldering material 15 and the medium 19 respectively are adapted to one another so that when the soldering material 15 melts the medium 19 evaporates. This ensures on the one hand that after the joint has been made, no residues of medium remain. On the other hand the temperature of the soldering material 15 during melting is limited by evaporation of the medium 19.

FIG. 2 is a variant illustrating application of the joining process to "flip-chip bonding", in which the die or chip 10 shown in FIG. 1 is replaced by a die or chip 20 mounted on a substrate 21 and formed with raised contact-metal coatings or "bumps" 26 on its contact surfaces 22.

FIG. 2 shows the starting position for subsequently joining the chip 20 to the substrate 21, in which the bumps 26 on the chip 20 are positioned so as to overlap soldering pads 27 arranged and distributed on the surface of the substrate 21 so as to correspond to the bumps 26 and positioned on contact surfaces 28 of the substrate 21.

In the embodiment shown in FIG. 2, the layer of medium 19 is applied in a number of partial applications in the form of fluid meniscuses 29 deposited on the soldering pads 27 on the substrate 21. The meniscuses 29 can be applied e.g. by an arrangement of nozzles on a tool (not shown) for applying the medium 19, the nozzles being distributed in correspondence with the soldering pads 27 on the surface of the substrate 21. Alternatively, as in the embodiment shown in FIG. 1, the medium 19 can be applied in the form of a continuous layer 18, in which case the medium 19 will also be disposed in the spaces 30 between the soldering pads 27.

The operation of joining or heating the chip 20 and/or the substrate 21 is the same in the embodiment shown in FIG. 2 as in the embodiment shown in FIG. 1.

We claim:

1. A method of joining an electronic component having contact surfaces to a substrate having contact surfaces, the surfaces of at least one of the electronic component and the substrate having solderable or weldable joining material, comprising: applying an inert, acid-free polyalcohol-containing medium to the contact surfaces of either or both of the electronic component and the substrate while said electronic component contact surfaces are spaced apart from said substrate contact surfaces, bringing the contact surfaces of the electronic component and the substrate into contact with each other under sufficient pressure to break up any oxide skins formed therebetween, and heating the contact surfaces sufficiently to melt the joining material, wherein the polyalcohol-containing medium forms an inert, acid-free atmosphere during the heating step which shields the contact surfaces of the electronic component and the substrate being joined to prevent oxide skin from reforming during heating.

2. A method according to claim 1, wherein the polyalcohol used is glycerol.

3. A method according to claim 1, wherein the applied layer is continuous.

4. A method according to claim 1, wherein the applied layer comprises individual partial layers associated with the respective contact surface pairings between the electronic component and the substrate.

5. A method according to claim 3, wherein the joining material is in the form of a separate moulding disposed on the contact surfaces of the substrate.

6. A method according to claim 4, wherein the joining material is in the form of a separate moulding disposed on the contact surfaces of the substrate.

7. A method according to claim 3, wherein the joining material is in the form of elevated contact-metal coatings disposed on the contact surfaces of the component.

8. A method according to claim 4, wherein the joining material is in the form of elevated contact-metal coatings disposed on the contact surfaces of the component.

9. A method according to claim 5, wherein one or both of the component and the substrate are heated to a starting temperature before heating to the temperature sufficient to melt the joining material.

10. A method according to claim 7, wherein one or both of the component and the substrate are heated to a starting temperature before heating to the temperature sufficient to melt the joining material.

11. A method according to claim 6, wherein one or both of the component and the substrate are heated to a starting temperature before heating to the temperature sufficient to melt the joining material.

12. A method according to claim 8, wherein one or both of the component and the substrate are heated to a starting temperature before heating to the temperature sufficient to melt the joining material.

13. A method according to claim 5, wherein the polyalcohol-containing medium has a boiling point equal to or only slightly above the melting temperature of the joining material.

14. A method according to claim 7, wherein the polyalcohol-containing medium has a boiling point equal to or only slightly above the melting temperature of the joining material.

15. A method according to claim 6, wherein the polyalochol-containing medium has a boiling point equal to or only slightly above the melting temperature of the joining material.

16. A method according to claim 8, wherein the polyalcohol-containing medium has a boiling point equal to or only slightly above the melting temperature of the joining material.

17. A method according to claim 13, wherein the polyalcohol is glycerol.

18. A method according to claim 14, wherein the polyalcohol is glycerol.

19. A method according to claim 15, wherein the polyalcohol is glycerol.

20. A method according to claim 16, wherein the polyalcohol is glycerol.

* * * * *

UNITED STATES PATENT AND TRADEMARK OFFICE
Certificate

Patent No. 5,785,234                                                                     Patented: July 28, 1998

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Stefan Weiss, Berlin, Fed. Rep. Germany; Elke Zakel, Berlin, Fed. Rep. Germany; and Christine Kallmayer, Berlin, Fed. Rep. Germany.

Signed and Sealed this Tenth Day of September 2002.

TOM DUNN
*Supervisory Patent Examiner*
Art Unit 1725